(12) United States Patent
Cohen et al.

(10) Patent No.: US 6,292,394 B1
(45) Date of Patent: Sep. 18, 2001

(54) METHOD FOR PROGRAMMING OF A SEMICONDUCTOR MEMORY CELL

(75) Inventors: Zeev Cohen, Safed; Boaz Eitan, Ra'anana; Eduardo Maayan, Kfar Saba, all of (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 09/606,205

(22) Filed: Jun. 29, 2000

(51) Int. Cl.[7] .................................................... G11C 16/04
(52) U.S. Cl. ........................ 365/185.19; 365/185.03; 365/185.22
(58) Field of Search ........................ 365/185.19, 185.03, 365/185.22, 185.14, 185.29

(56) References Cited

U.S. PATENT DOCUMENTS

| 5,172,338 | 12/1992 | Mehrotra et al. . |
|---|---|---|
| 5,172,388 | 12/1992 | Mehrotra et al. . |
| 5,523,972 | 6/1996 | Rashid et al. . |
| 5,870,335 | 2/1999 | Khan et al. . |
| 5,991,202 | * 11/1999 | Derhacobian et al. .......... 365/185.19 |

* cited by examiner

*Primary Examiner*—David Nelms
*Assistant Examiner*—David Lam
(74) *Attorney, Agent, or Firm*—Eitan, Pearl, Latzer & Cohen-Zedek

(57) ABSTRACT

A method for programming an array having a multiplicity of memory cells. The method includes, per cell to be programmed, verifying a programmed or non-programmed state of the cell and flagging those of the cells that verify as non-programmed during one of the verify steps after having previously verified as programmed. A programming pulse having a programming level is applied to the non-programmed cells which are not flagged cells. The steps of verifying, flagging and applying are then repeated until all of the cells verify as programmed at least once. Subsequently, a boost pulse having a boost programming level lower than the programming level is applied to the flagged cells.

31 Claims, 5 Drawing Sheets

METHOD FOR PROGRAMMING OF A SEMICONDUCTOR MEMORY CELL

CROSS REFERENCE TO RELATED APPLICATIONS

This application is related to the U.S. patent application Ser. No. 09/563,923, titled PROGRAMMING OF NON-VOLATILE MEMORY CELLS filed on May 4, 2000.

FIELD OF THE INVENTION

The present invention relates to methods for programming of semiconductor memory cells in general, and particularly, to methods for programming to any threshold level.

BACKGROUND OF THE INVENTION

A typical method for programming a nonvolatile semiconductor memory cell, such as a nitride, read only memory cell (NROM), involves initially applying a programming pulse thereto, thus causing charge to become trapped in a retention layer of the cell. This trapped charge induces the threshold voltage $V_{TH}$ of the cell to increase.

Ordinarily, the programming pulse is followed by a program verify pulse. Via various known in the art methods, the program verify pulse verifies the programmed level of the cell. In memory cells such as the NROM, this is accomplished via a reverse read action. If the program verify pulse reveals that the cell has not yet reach the programmed level, an additional programming pulse is applied, followed by a subsequent program verify pulse. Typically, during the programming process, the programming pulses increase in voltage level, commencing at a relatively low voltage level and terminating at a higher level voltage. An example of such is described in Applicant's co-pending U.S. patent application Ser. No. 09/563,923 Programming Of Nonvolatile Memory Cells, filed on May 4, 2000 and incorporated herein by reference.

When the cell passes program verify, the cell is considered "programmed", and the programming process is terminated. If however, due to noise, charge leakage and the like, the program verify pulse of a programmed cell does not accurately verify the programmed state of the cell, further programming may induce too much charge into the retention layer, and cause a condition known as over-programming. In applications such as NROM, it is important to prevent over-programming of the cell. Over-programming of the cell creates a broad pocket of trapped charge, which reduces the longevity of the cell.

Conversely, if the cell is under-programmed, the threshold voltage $V_{TH}$ of the cell will not be high enough to read as programmed. Thus, inaccurate programming/verifying methods result in cell program mis-readings, and subsequent cell mis-programming.

The opposite procedure of programming is usually referred to as "erase". For electrically erasable programmable read only memory (EEPROM) cells, erasure changes the threshold voltage in the opposite direction to that of programming. It is equally important to prevent over-erasure (as over-programming), so as to avoid excessive reduction of the threshold voltage and subsequent deterioration in the quality of the cell's composition.

U.S. Pat. No. 5,523,972 discusses a programming method wherein each cell is queried for program verification. Those cells that pass verification are marked as programmed and are not queried again. Hence, since the method does not teach repeat queries, cells that have slipped below the programmed voltage threshold $V_{TH}$ are not discovered.

Alternatively, U.S. Pat. No. 5,172,338 discusses repeated query of the cells. Each cell that does not pass program verify, either on a previous query or on a subsequent query, receives a program pulse. However, for those cells which pass a previous program verify, yet failed a subsequent verify, it is risky to apply program pulses, since the continuance of programming subjects those cells to the possibility of over-programming.

It is thus important to devise an accurate method that supports generally precise programming of cells to a level that insures a reliability margin.

SUMMARY OF THE PRESENT INVENTION

It is an object of the present invention to provide a method for programming of the threshold voltage of a semiconductor memory cells. In embodiments of the present invention, the programming methods described herein are applicable to both programming and erasure.

There is therefore provided in accordance with a preferred embodiment of the present invention, a method for programming an array having a multiplicity of memory cells. The method includes, per cell to be programmed, verifying a programmed or non-programmed state of the cell and flagging those of the cells that verify as non-programmed during one of the verify steps after having previously verified as programmed. A programming pulse having a programming level is applied to the non-programmed cells which are not flagged cells. The steps of verifying, flagging and applying are then repeated until all of the cells verify as programmed at least once. Subsequently, a boost pulse having a boost programming level lower than the programming level is applied to the flagged cells.

Alternatively, the step of repeating includes increasing the programming level of the programming pulse. The programming level may be increased by between 0.05 to 0.3 volts. External means may be used to determine the increase, which may be either constant or variable voltage increases. The programming pulses may also vary in length of time.

The first step of applying includes the step of applying a programming pulse to a gate, a drain, or a source of the non-programmed cells which are not flagged cells.

The step of verifying may include determining a verifying level by external means, where the verifying level may be a constant voltage level or a variable voltage level. The step of verifying may also include verifying whether a threshold voltage of a cell is below a determined level.

There is therefore provided in accordance with an alternative preferred embodiment of the present invention, a method for erasing an array having a multiplicity of memory cells. The method includes the steps of, per cell to be erased, verifying an erased or non-erased state of the cell and flagging those of the cells that verify as non-erased during one of the verify steps after having previously verified as erased. An erasing pulse having an erasure level is applied to the non-erased cells which are not flagged cells. The steps of verifying, flagging and applying are repeated until all of the cells have verified as the erased at least once. Subsequently, a boost pulse having a boost erase level lower than the erased level is applied to the flagged cells.

The step of repeating includes increasing the erasure level of the erasing pulse, sometimes by between 0.05 to 0.3 volts. The erasure level may be determined by external means and may be increased by constant voltage steps or by variable voltage steps. The erasure pulses may vary in length of time.

The first step of applying includes applying a programming pulse to a gate, a drain, or a source of the non-programmed cells which are not flagged cells. The step of verifying includes verifying whether a threshold voltage of a cell is above a determined level.

There is therefore provided in accordance with an alternative preferred embodiment of the present invention, a method for programming an array having a multiplicity of memory cells. The method includes the steps of, per cell to be programmed, verifying a coarse programmed or non-programmed state of the cell and flagging those of the cells that verify as non-programmed during one of the verify steps after having previously verified as programmed. A coarse programming pulse having a coarse programming level is applied to the non-programmed cells which are not flagged cells.

The steps of verifying, flagging and applying are repeated until all of the cells verify as programmed at least once. A fine programming pulse is then applied to the flagged cells. Next, a complete programmed state or a complete non-programmed state of the cell is verified and the second steps of verifying and applying are repeated until all of the cells are very as fully programmed at least once.

The first step of verifying includes verifying a cell threshold voltage to a level that is within α volts of a desired threshold voltage. Sometimes α is in the range of 0.2–0.5 volt, where α is the maximum change in threshold voltage that can be induced in a cell with a coarse programming pulse.

The second step of verifying may also include verifying if a threshold voltage of the cell is within α volts of a desired threshold voltage and if the verified level is greater than the α volts, repeating the first steps of verifying, flagging and applying until all of the cells verify with within α volts of a desired threshold voltage.

There is therefore provided in accordance with an alternative preferred embodiment of the present invention, a method for an array having a multiplicity of memory cells. The method includes, per cell to be programmed, verifying a programmed or non-programmed state of the cell and flagging those of the cells that verify as non-programmed during one of the program verify steps after having previously verified as programmed. A programming pulse having a programming level is applied to the non-programmed cells which are not flagged cells and a recovery pulse having a recovery level lower than the programming level is applied to the flagged cells. The steps of verifying, flagging, applying and applying are repeated until all of the cells verify as the programmed at least once. The recovery level may be 0.05V.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
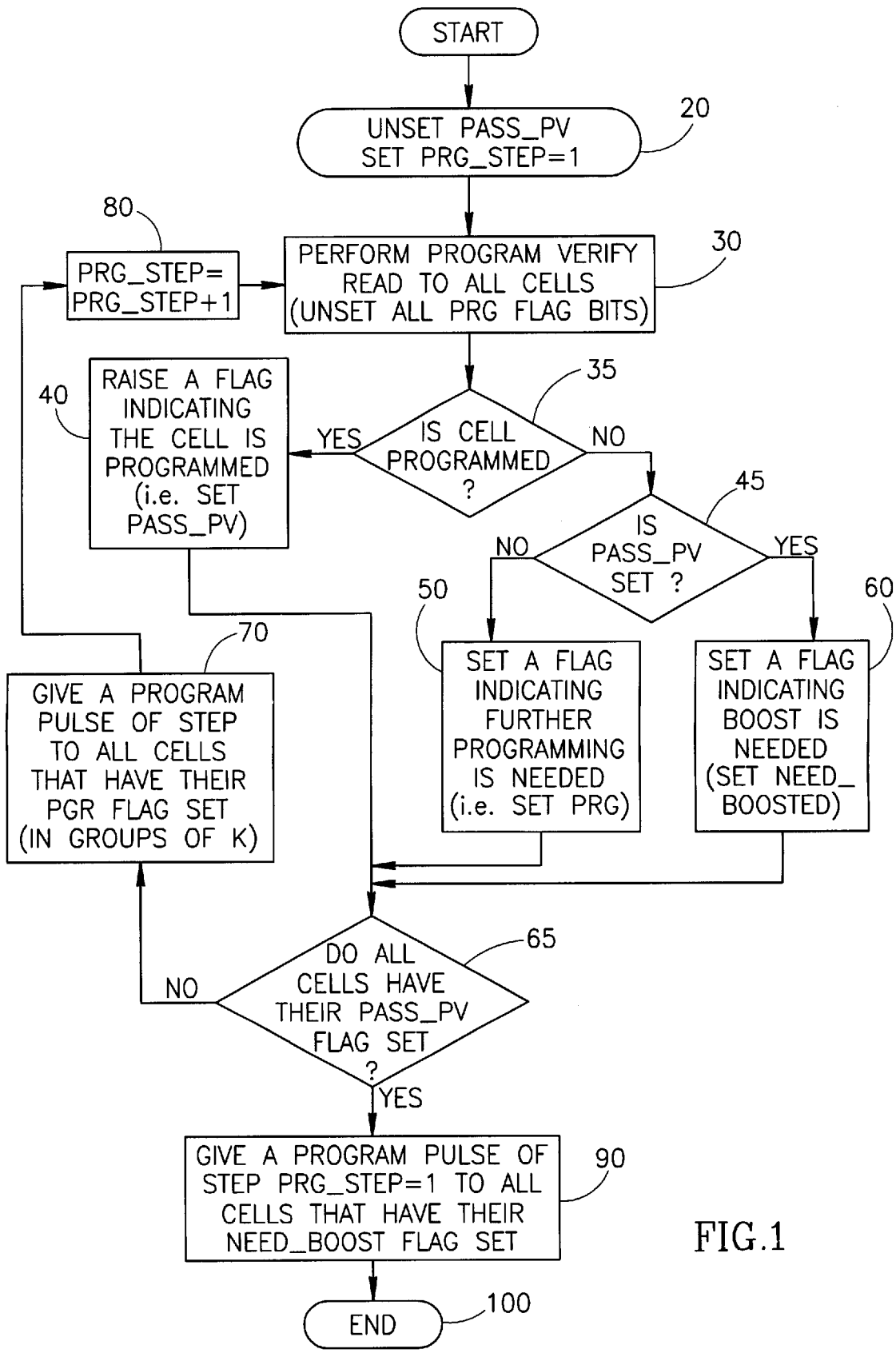
FIG. 1 is a flow chart of a programming method, operative in accordance with a preferred embodiment of the present invention.

Reference is now made to FIG. 1, which is a flow chart of a method for programming semiconductor memory cells, operative in accordance with a preferred embodiment of the present invention.

It is noted that the methods described herein for programming are also applicable for erasure. As such, references to programming are to be understood as to refer also to erasure, unless otherwise stated.

The present invention is a programming method which applies multiple program verify cycles, thus increasing the accuracy of the verify read. Additionally, the present invention teaches a method which reduces the possibility of over-programming via application of a low voltage level boost pulse to those cells which originally pass program verify, however in subsequent program verify readings, measure a lower threshold voltage than required. Alternative embodiments teach application of the same principles to erase, as applicable.

In an embodiment illustrated in FIG. 1, the present invention commences with clearing (step 20) all pass program verify (PASS_PV) flags associated with the cells designated to be programmed, and setting the voltage level of the programming pulse to an initial value of PRG_STEP=1. It is noted that flags are known in the art methods for marking or tagging a cell. Although flags are discussed herein, other methods for marking or tagging cells are included within the scope of the invention taught herein.

In step 30, all the PRG flags associated with the designated cells are cleared and a program verify pulse is applied to all the designated cells.

The results of step 30 are queried (query box 35), determining the program or non-program state of the designated cells. The cells that pass program verify are determined to be programmed, and each such cell is set (step 40) with an associated PASS_PV flag.

The cells that do not pass program verify are queried (query box 45) for the presence of associated PASS_PV flags.

1. For each cell that is not marked with an associated PASS_PV flag, an associated PRG flag is set (step 50), thus indicating that the associated cell requires further programming.
2. For each cell that is marked with an associated PASS_PV flag, a NEED_boost flag is set (step 60), indicating that the associated cell, which once passed program verify, requires a boost pulse. Hereinbelow is a detailed description of the boost pulse.

It is noted that there are instances when a cell passes program verify in a previous program verify pulse, however, afterward, due to charge loss, array effects, operational conditions and the like, voltage leaks from the cell. Consequently, the cell may not pass subsequent program verifies. In the inventive method disclosed herein, a cell, that has passed program verify once but not a subsequent time, is subject to the above mentioned boost pulse. The boost pulse has a lower voltage level than that typically used for programming pulses. The low voltage level boost pulse reduces the possibility of over-programming, which many times is a result of excessively high programming voltage levels.

All the cells that have passed through steps 40, 50 or 60 are queried (query box 65) for the presence of associated PASS_PV flags. If there are any cells that are not set with an associated PV_PASS flag, all the cells, irrespective of the associated flags, advance to step 70.

In step 70, each cell that is set with an associated PRG flag is subject to a programming pulse of voltage level PRG_STEP. It is noted that the programming pulse is applied only to those cells with associated PRG flags; the cells that are set with an associated PV_PASS or NEED_boost flags do not receive the program pluses. Preferably, the programming pulse is applied to K cells at a time.

The voltage level of the programming pulse is increased (step 80) to the next step. In one embodiment, the initial voltage level of PRG_STEP is the lowest possible programming voltage level, such as 3.5–4 volts for increasing the threshold voltage (e.g. programming) and 6.5–7.0 volts for decreasing the threshold voltage (e.g. erasure), and each successive pulse is incremented/decremented by 0.2–0.4 volts.

It is noted that there are methods for defining the appropriate initial voltage level and methods for determining the size of the voltage increment/decrement. In some embodiments the level and/or size may be predetermined and/or determined by external means. Likewise, in alternative embodiments, the level and/or size may be variable or constant.

Steps 30 to step 80 are repeated until all the cells are set with an associated PV_PASS flag and the result of query box 65 is affirmative for all cells. The voltage level of the programming pulse is then set (step 90) to the initial level of PRG_STEP=1, which is the voltage level of the boost pulse. The boost pulse is applied to each cell that has an associated NEED_boost flag, preferably applied in groups of K cells at a time. The method is terminated in step 100.

It is noted that for all methods described herein, if a cell does not pass the verify query after numerous cycles, such as 12–18 cycles, than external to the algorithm, the process is stopped.

The method described above therefore teaches monitoring the verified cell via repetitive verification query, hence increasing the accuracy of the verify read. Furthermore, the method teaches applying a reduced voltage boost to those cells that pass verify once but not on subsequent queries. Consequently, the present invention provides generally precise verification techniques and a complementary programming system that provides for accurate cell programming.

Figure 2A:
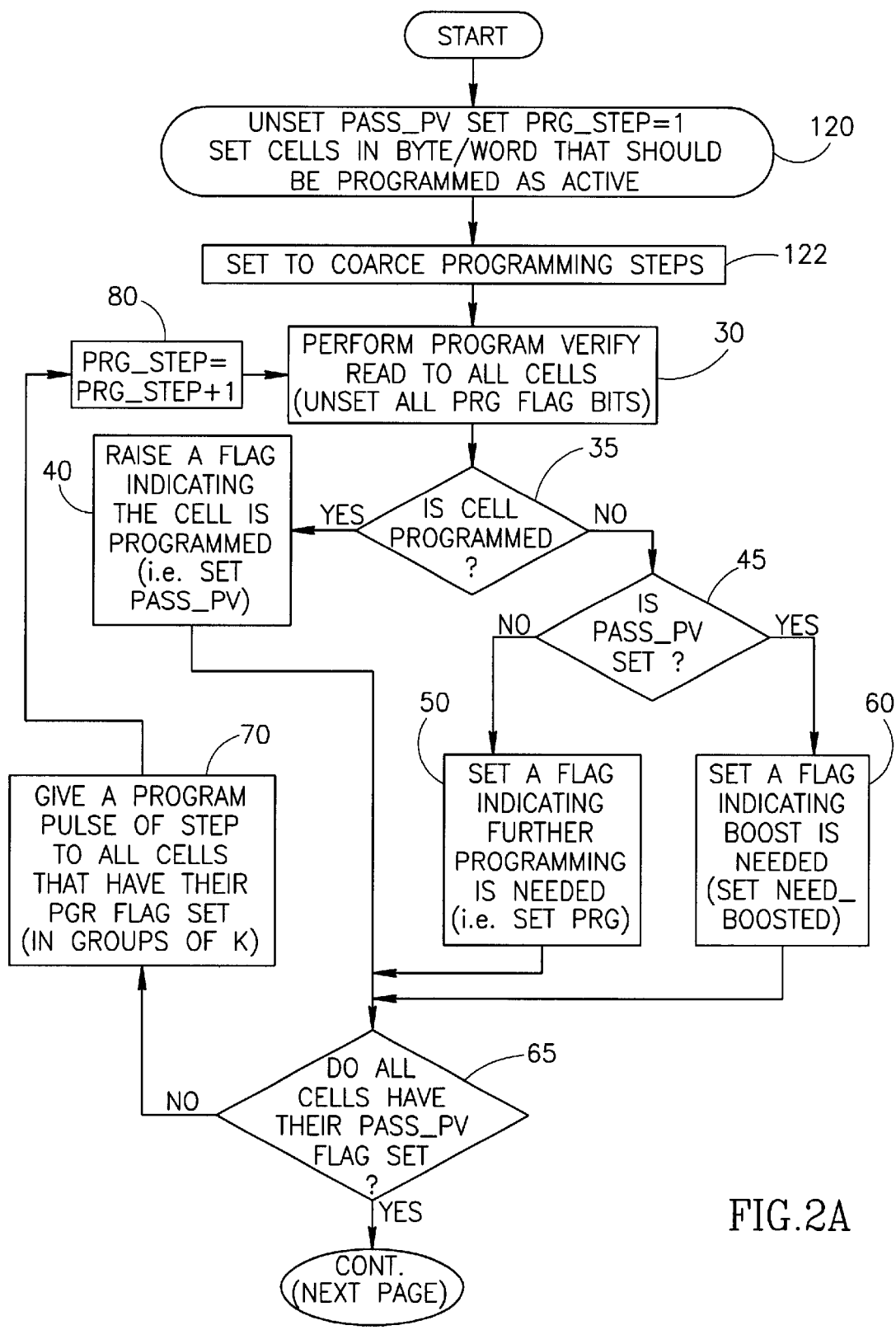
FIGS. 2A and 2B are a flow chart of an alternative programming method, operative in accordance with a preferred embodiment of the present invention.
Figure 2B:
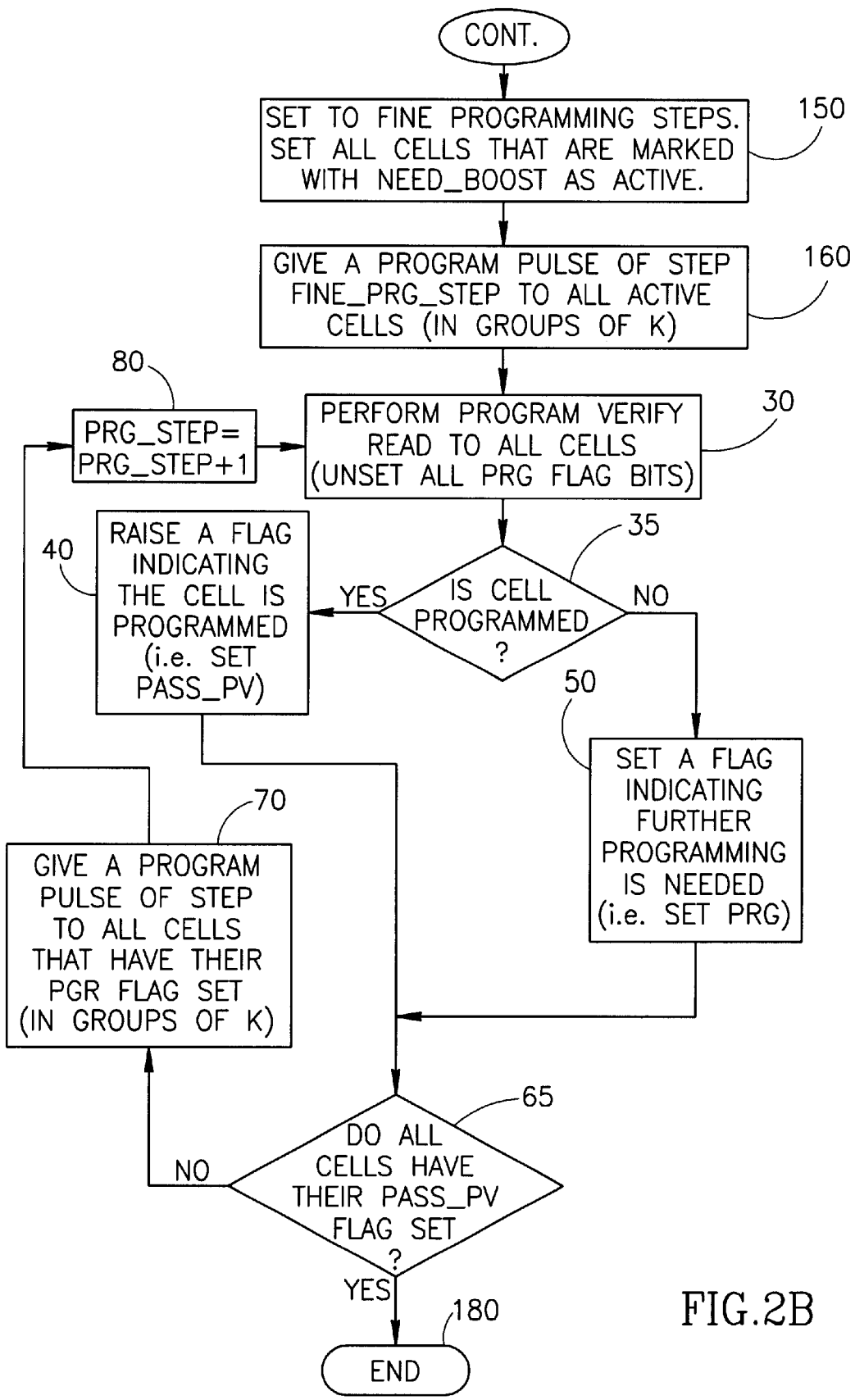

Reference is now made to FIGS. 2A and 2B, an alternative preferred method, operative in accordance with a preferred embodiment of the present invention. Steps and queries that have been described hereinabove are similarly numbered and will not be described further. The method depicted in FIGS. 2A and 2B is a fast algorithm that combines multiple levels of voltage steps, thus providing for a faster programming algorithm with a lesser risk of over programming.

The embodiment described in FIGS. 2A and 2B provides for large speed gains in the early stages of the programming algorithm, with smaller, finer steps toward the final critical stage close to a final voltage threshold $V_{TH\text{-}FINAL}$. FIGS. 2A and 2B commence with clearing the PASS_PV flags associated with the cells designated to be programmed and setting (step 120) the voltage level of the programming pulse to an initial value of PRG_STEP=1.

The program algorithm governing the stepping of the voltage level of the programming pulses is set (step 122) to coarse, preferably stepping the voltage level in increments of approximately 0.3–1.0 volts each step.

The program verify level is also set to a coarse level, such that it is within a delta of α from a desired final threshold voltage $V_{TH\text{-}FINAL}$, where the value of α is equivalent to the maximum voltage that a single coarse programming pulse can generate. α is usually approximately 0.2 volts, but may vary depending on the characteristics of the NROM cell, and sometimes even within the same NROM array.

This alternative method then proceeds with steps 30 to 80 until each cell is set with an associated PV_PASS flag, thus all the results of query box 65 are affirmative, indicating that all cells have a threshold voltage in the area of (threshold voltage $V_{TH\ FINAL}-\alpha$).

The program algorithm governing the voltage level of the programming is then set (step 150) to fine steps (FINE_PRG_STEP), preferably stepping the voltage level in increments of 0.05 volts each step and setting the program verify level to the final desired threshold voltage $V_{TH\text{-}FINAL}$ level. Additionally, all cells that have been marked with associated NEED_BOOST flags are marked as active.

A program pulse of size FINE_PRG_STEP (step 160) is applied to all the cells that have been marked as active.

Steps 30, 35, 40, 50, 65, 70 and 80 are repeated until each cell is set with an associated PV_PASS flag. The method is terminated (step 180).

A fine program verify allows for a relatively smaller voltage margin, and although it produces a slower programming algorithm, it is more generally precise. It thus noted that in order to achieve fast, nevertheless accurate programming algorithm, one embodiment of the present invention teaches alternating back and forth between the coarse stage and the fine stage. As such, steps 120 to 65 and steps 150 to 65 are alternated back and forth, as appropriate. A indicator as to when to move from coarse to fine is when the threshold voltage level $V_{TH}$ of the cells to be programmed is smaller than α. Conversely, an indicator when to move from fine to coarse is when the threshold voltage level $V_{TH}$ of the cells to be programmed is large than α.

Figure 3:
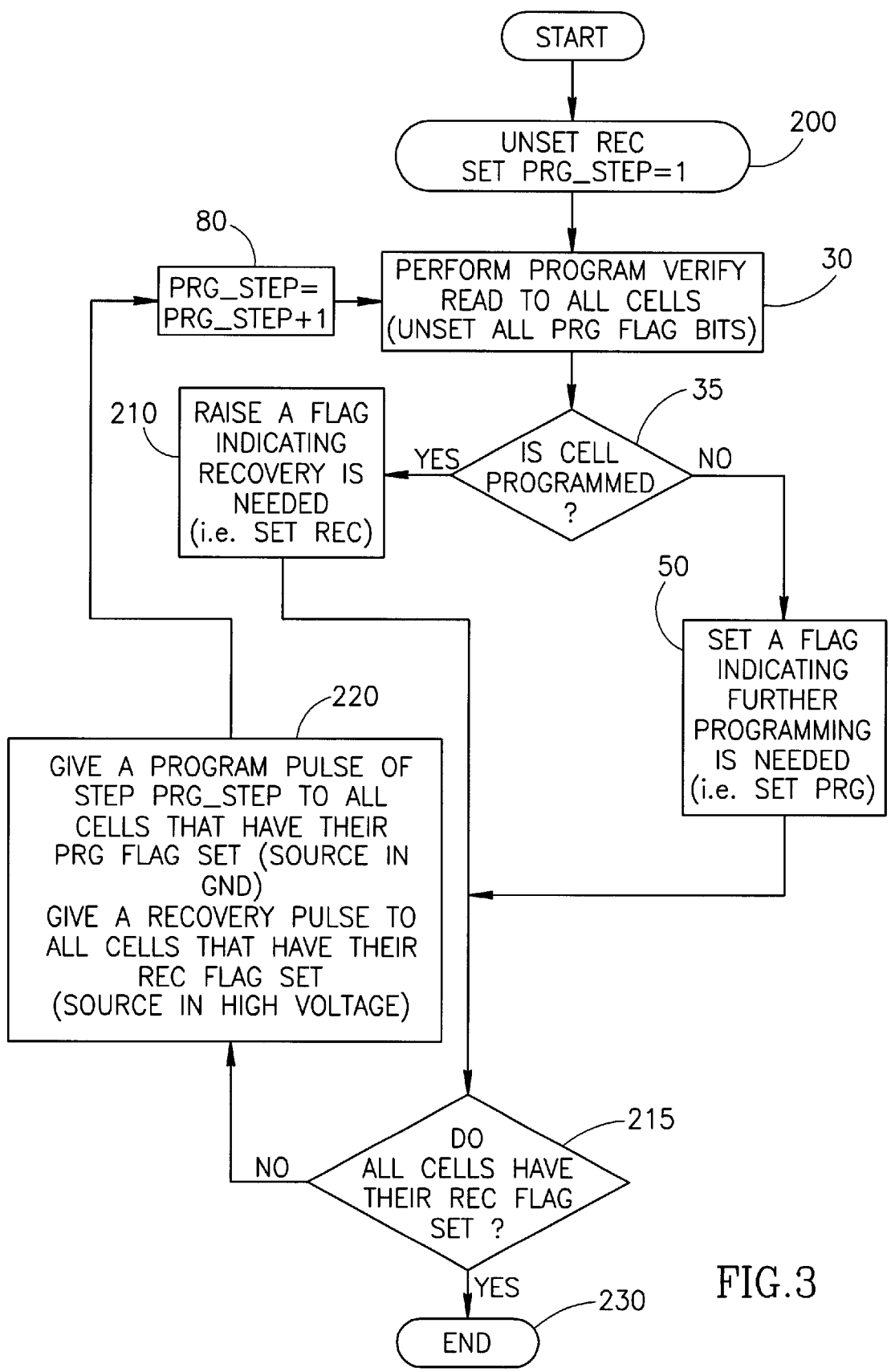
FIG. 3 is a flow chart of a further alternative programming method, operative in accordance with a preferred embodiment of the present invention.

Reference is now made to FIG. 3, an alternative method, operative in accordance with an embodiment of the present invention. Steps and queries which have been described hereinabove are similarly numbered and will not be described further.

The alternative method depicted in FIG. 3 teaches multiple cycles of program verify combined with corresponding application of recovery pulses. Thus the voltage threshold level of the cell is maintained, avoiding the possibility of voltage slippage during the programming cycles.

FIG. 3 commences with setting (step 200) the voltage level of the programming pulse to an initial value of PRG_STEP=1. Step 200 additionally entails clearing all the recovery verify (REC) flags associated with the cells designated to receive a REC pulse. Preferably the REC pulse is of a low programming voltage.

The method then proceeds to steps 30 and 35.

1. The cells that pass the query for program verify (query box 35) are determined to be programmed. Each such cell is set (step 210) with an associated recovery (REC) flag, thus indicating that the associated cell has passed program verify, however, it needs to be subjected to a REC boost before completion of the process. It is noted that once a cell is set with an associated REC flag, the flag is not cleared until the completion of the programming process.
2. The cells that do not pass the program verify query (query box 35) are set with an associated PRG flag (step 50), thus indicating that the associated cell requires further programming.

All the cells are then queried (query box 215) for the presence of associated REC flags. If there are any cells that are not set with an associated REC flag, all the cells, irrespective of the associated flags, advance to step 220.

In step 220, each cell that is set with an associated PRG flag is subject to a programming pulse of voltage level PRG_STEP and each cell that is set with an associated REC flag receives a REC pulse. Preferably, the pulses are applied to K cells at a time.

The voltage level of the programming pulse is increased (step 80) by 1. Steps 30, 35, 210, and 50 are repeated until all the cells are set with an associated REC flag and the result of query box 215 is affirmative. The method is terminated in step 230.

Figure 4:
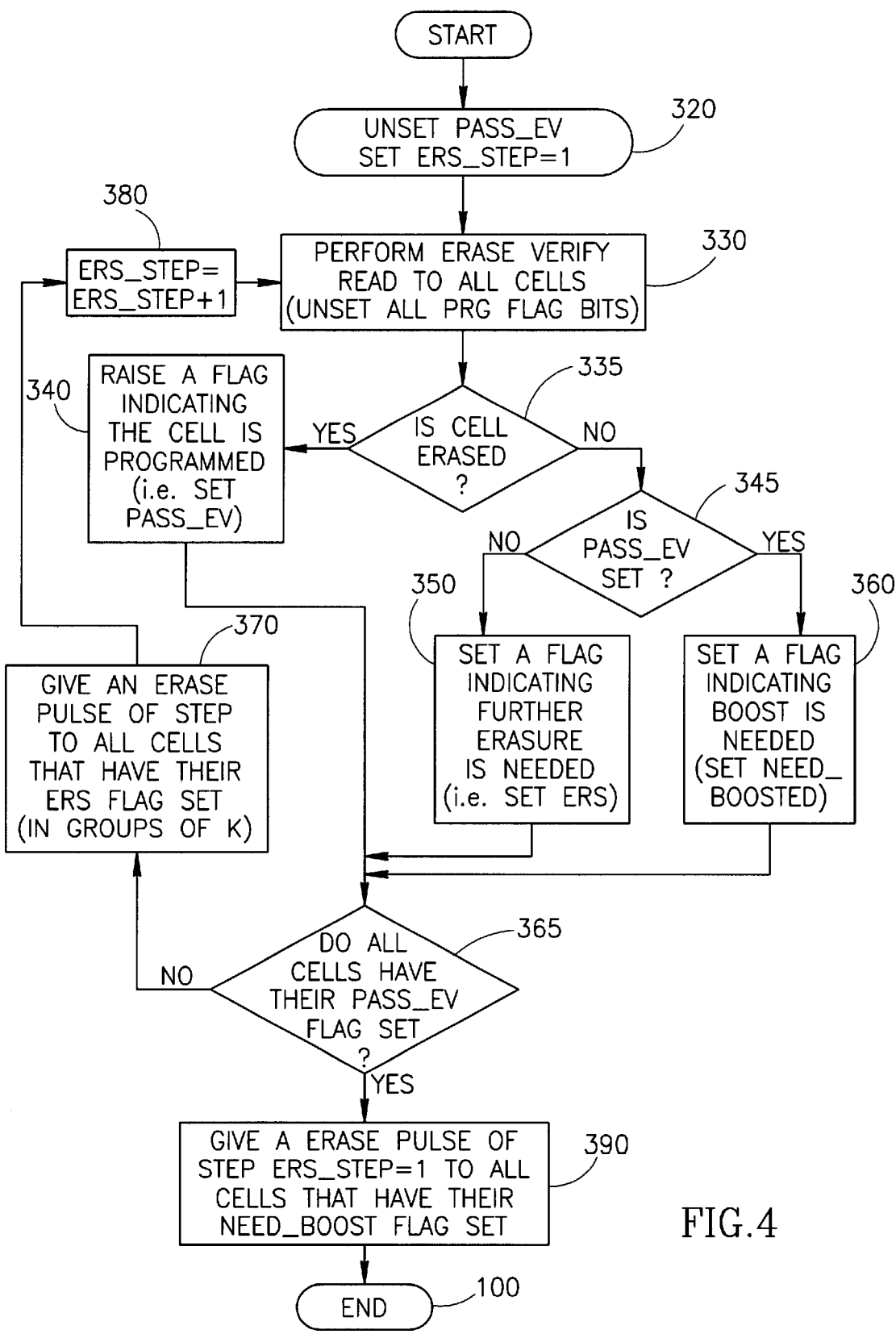
FIG. 4 is a flow chart of an erase method, constructed and operative in accordance with a preferred embodiment of the present invention.

Reference is now made to FIG. 4, a flow chart of an alternative embodiment for erase method which inhibits the risk of under-erasure or over-erasure (insufficient versus excess depletion of charge, respectively) of the NROM cell.

The method illustrated in FIG. 4 is similar to that described in connection to FIG. 1, however, whereas programming is the procedure for inducing charge into the retention layer, erasure is the procedure for depleting the charge from the retention layer. Hence, it is noted that function performed by the PRG pulses is comparable to the function performed by the erase (ERS) pulses, and function of the program verify pulses is comparable to the function of the erase verify pulses. Thus, the procedure depicted in steps 20–100 (FIG. 1) is similar to the procedure depicted in steps 320–100 (FIG. 4.). Similarly, the embodiments as depicted in FIGS. 2A/B and 3 are comparably applicable for erasure embodiments, and although not illustrated herein, are covered within the principles of this invention.

It is additionally noted that herein are described specific operations and applications of the present invention, however, it is apparent to those skilled in the arts that there are equivalent methods which are applicable substitutes, and therefore covered within the principles of the present invention.

It will be appreciated by persons skilled in the art that the present invention is not limited to what has been particularly shown and described hereinabove. Rather the scope of the present invention is defined only by the claims which follow.

What is claimed is:

1. A method for programming an array having a multiplicity of memory cells, the method comprising the steps of:
   per cell to be programmed, verifying a programmed or non-programmed state of said cell;
   flagging those of said cells that verify as non-programmed during one of said verify steps after having previously verified as programmed;
   applying a programming pulse having a programming level to said non-programmed cells which are not flagged cells;
   repeating said steps of verifying, flagging and applying until all of said cells verify as programmed at least once; and
   applying a boost pulse having a boost programming level lower than said programming level to said flagged cells.

2. A method according to claim 1, wherein said step of repeating comprises the step of increasing said programming level of said programming pulse.

3. A method according to claim 2, wherein said step of increasing comprises the step of increasing said programming level by between 0.05 to 0.3 volts.

4. A method according to claim 2, wherein said step of increasing comprises the step of determining said programming level by external means.

5. A method according to claim 2, wherein said step of increasing comprises the step of increasing said programming level by constant voltage steps.

6. A method according to claim 2, wherein said step of increasing comprises the step of increasing said programming level by variable voltage steps.

7. A method according to claim 1, wherein said programming pulses vary in length of time.

8. A method according to claim 1, and wherein said first step of applying comprises the step of applying a programming pulse to a gate, a drain, or a source of said non-programmed cells which are not flagged cells.

9. A method according to claim 1, wherein said step of verifying comprises the step of determining a verifying level by external means.

10. A method according to claim 1, wherein said step of verifying comprises the step of determining a verifying level having a constant voltage level.

11. A method according to claim 1, wherein said step of verifying comprises the step of determining a verifying level having a variable voltage level.

12. A method according to claim 1, wherein said step of verifying comprises the step of verifying whether a threshold voltage of a call is below a determined level.

13. A method for erasing an array having a multiplicity of memory cells, the method comprising the steps of:
   per cell to be erased, verifying an erased or non-erased state of said cell;
   flagging those of said cells that verify as non-erased during one of said verify steps after having previously verified as erased;
   applying an erasing pulse having an erasure level to said non-erased cells which are not flagged cells;
   repeating said steps of verifying, flagging and applying until all of said cells have verified as said erased at least once; and applying a boost pulse having a boost erase level lower than said erased level to said flagged cells.

14. A method according to claim 13, wherein said step of repeating comprises the step of increasing said erasure level of said erasing pulse.

15. A method according to claim 14, wherein said step of increasing comprises the step of increasing said erasure level by between 0.05 to 0.3 volts.

16. A method according to claim 14, wherein said step of increasing comprises the step of determining said erasure level by external means.

17. A method according to claim 14, wherein said step of increasing comprises the step of increasing said erasure level by constant voltage steps.

18. A method according to claim 14, wherein said step of increasing comprises the step of increasing said erasure level by variable voltage steps.

19. A method according to claim 13, wherein said erasure pulses vary in length of time.

20. A method according to claim 13, wherein said first step of applying comprises the step of applying a programming pulse to a gate, a drain, or a source of said non-programmed cells which are not flagged cells.

21. A method according to claim 13, wherein said step of verifying comprises the step of determining a verifying level by external means.

22. A method according to claim 13, wherein said step of verifying comprises the step of determining a verifying level having a constant voltage level.

23. A method according to claim 13, wherein said step of verifying comprises the step of determining a verifying level having a variable voltage level.

24. A method according to claim 13, wherein said step of verifying comprises the step of verifying whether a threshold voltage of a cell is above a determined level.

25. A method for programming an array having a multiplicity of memory cells, the method comprising the steps of:

per cell to be programmed, verifying a coarse programmed or non-programmed state of said cell;

flagging those of said cells that verify as non-programmed during one of said verify steps after having previously verified as programmed;

applying a coarse programming pulse having a coarse programming level to said non-programmed cells which are not flagged cells;

repeating said steps of verifying, flagging and applying until all of said cells verify as programmed at least once;

applying a fine programming pulse to said flagged cells;

verifying a complete programmed state or a complete non-programmed state of said cell; and repeating the second steps of verifying and applying until all of said cells are very as fully programmed at least once.

26. A method according to claim 25, wherein the first step of verifying comprises verifying a cell threshold voltage to a level that is within $\alpha$ volts of a desired threshold voltage.

27. A method according to claim 26, wherein $\alpha$ is in the range of 0.2–0.5 volt.

28. A method according to claim 26, wherein $\alpha$ is the maximum change in threshold voltage that can be induced in a cell with a coarse programming pulse.

29. A method according to claim 25, wherein said second step of verifying comprises the steps of:

verifying if a threshold voltage of said cell is within $\alpha$ volts of a desired threshold voltage; and if said verified level is greater than said $\alpha$ volts, repeating said first steps of verifying, flagging and applying until all of said cells verify with within $\alpha$ volts of a desired threshold voltage.

30. A method for an array having a multiplicity of memory cells, the method comprising the steps of:

per cell to be programmed, verifying a programmed or non-programmed state of said cell;

flagging those of said cells that verify as non-programmed during one of said program verify steps after having previously verified as programmed;

applying a programming pulse having a programming level to said non-programmed cells which are not flagged cells;

applying a recovery pulse having a recovery level lower than said programming level to said flagged cells; and repeating said steps of verifying, flagging, applying and applying until all of said cells verify as said programmed at least once.

31. A method according to claim 30, wherein said recovery level is 0.05V.

* * * * *